United States Patent
Yu et al.

(10) Patent No.: US 12,249,391 B2
(45) Date of Patent: *Mar. 11, 2025

(54) LATCH TYPE SENSE AMPLIFIER

(71) Applicant: TAIWAN SEMICONDUCTOR MANUFACTURING COMPANY, LTD., Hsinchu (TW)

(72) Inventors: Hua-Hsin Yu, Hsinchu (TW); Hung-Jen Liao, Hsinchu (TW); Cheng-Hung Lee, Hsinchu County (TW); Hau-Tai Shieh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/504,686

(22) Filed: Nov. 8, 2023

(65) Prior Publication Data

US 2024/0071428 A1 Feb. 29, 2024

Related U.S. Application Data

(63) Continuation of application No. 17/461,216, filed on Aug. 30, 2021, now Pat. No. 11,869,623.

(51) Int. Cl.
G11C 7/06 (2006.01)
(52) U.S. Cl.
CPC .................. G11C 7/065 (2013.01)
(58) Field of Classification Search
CPC .. G11C 7/065; G11C 7/062; H03K 3/356139; H03K 3/012
See application file for complete search history.

(56) References Cited

U.S. PATENT DOCUMENTS

| 5,532,628 A | 7/1996 | Viswanathan |
| 5,808,488 A | 9/1998 | Bruccoleri et al. |
| 5,959,910 A | 9/1999 | McClure |
| 6,445,621 B1 | 9/2002 | Heightley |

(Continued)

FOREIGN PATENT DOCUMENTS

WO    WO-2015005992 A1 *  1/2015    ............ H03K 3/012

OTHER PUBLICATIONS

Kobayashi et al., "A Current-Controlled Latch Sense Amplifier and a Static Power-Saving Input Buffer for Low-Power Architecture", IEEE Journal of Solid-State Circuits, Apr. 1993, vol. 28, No. 4, pp. 523-527.

*Primary Examiner* — Quan Tra
(74) *Attorney, Agent, or Firm* — Birch, Stewart, Kolasch & Birch, LLP

(57) ABSTRACT

A device is disclosed and includes an input stage circuit, a switching circuit, and a first latch circuit. The input stage circuit generates a first input signal having a first voltage and a second input signal based on a third input signal. The switching circuit operates in response to a first control signal, and adjusts a voltage level of a first data line according to the first input signal and a voltage level of a second data line according to the second input signal. The first latch circuit is coupled to the switching circuit by the first data line and the second data line. The first latch circuit latches a data in response to the first control signal and a second control signal, and adjusts the voltage level of the first data line based on a second voltage different from the first voltage.

20 Claims, 15 Drawing Sheets

(56) References Cited

U.S. PATENT DOCUMENTS

| | | |
|---|---|---|
| 6,664,943 B1 | 12/2003 | Nakajima et al. |
| 6,989,810 B2 | 1/2006 | Morita |
| 7,391,403 B2 | 6/2008 | Teranishi et al. |
| 7,411,432 B1 * | 8/2008 | Zhu .................. H03K 3/356156 |
| | | 326/98 |
| 8,064,241 B2 | 11/2011 | Morita et al. |
| 9,130,555 B2 | 9/2015 | Tanabe et al. |
| 9,438,212 B2 | 9/2016 | Trivedi et al. |
| 9,503,062 B2 * | 11/2016 | Singh .................... H03K 3/0372 |
| 10,186,318 B1 | 1/2019 | Yang et al. |
| 10,734,067 B1 | 8/2020 | Akamatsu et al. |
| 2008/0048731 A1 | 2/2008 | Huang |
| 2010/0237908 A1 | 9/2010 | Chatal |
| 2013/0049835 A1 | 2/2013 | Holst et al. |
| 2015/0349756 A1 * | 12/2015 | Kim ..................... H03K 3/0375 |
| | | 327/202 |
| 2016/0049938 A1 * | 2/2016 | Kim ..................... H03K 3/0375 |
| | | 326/9 |

* cited by examiner

LATCH TYPE SENSE AMPLIFIER

CROSS-REFERENCE TO RELATED APPLICATION

The present application is a continuation of U.S. patent application Ser. No. 17/461,216, filed Aug. 30, 2021, which is herein incorporated by reference.

BACKGROUND

Level shifters have been widely integrated in synchronous design circuits. In some applications, at least eight MOS transistors are constructed in a level shifter and induce great corresponding active power, cost area, and leakage consumption. Moreover, when there is a huge difference of voltage levels of power rails in the level shifter, propagation of signals are in risk.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
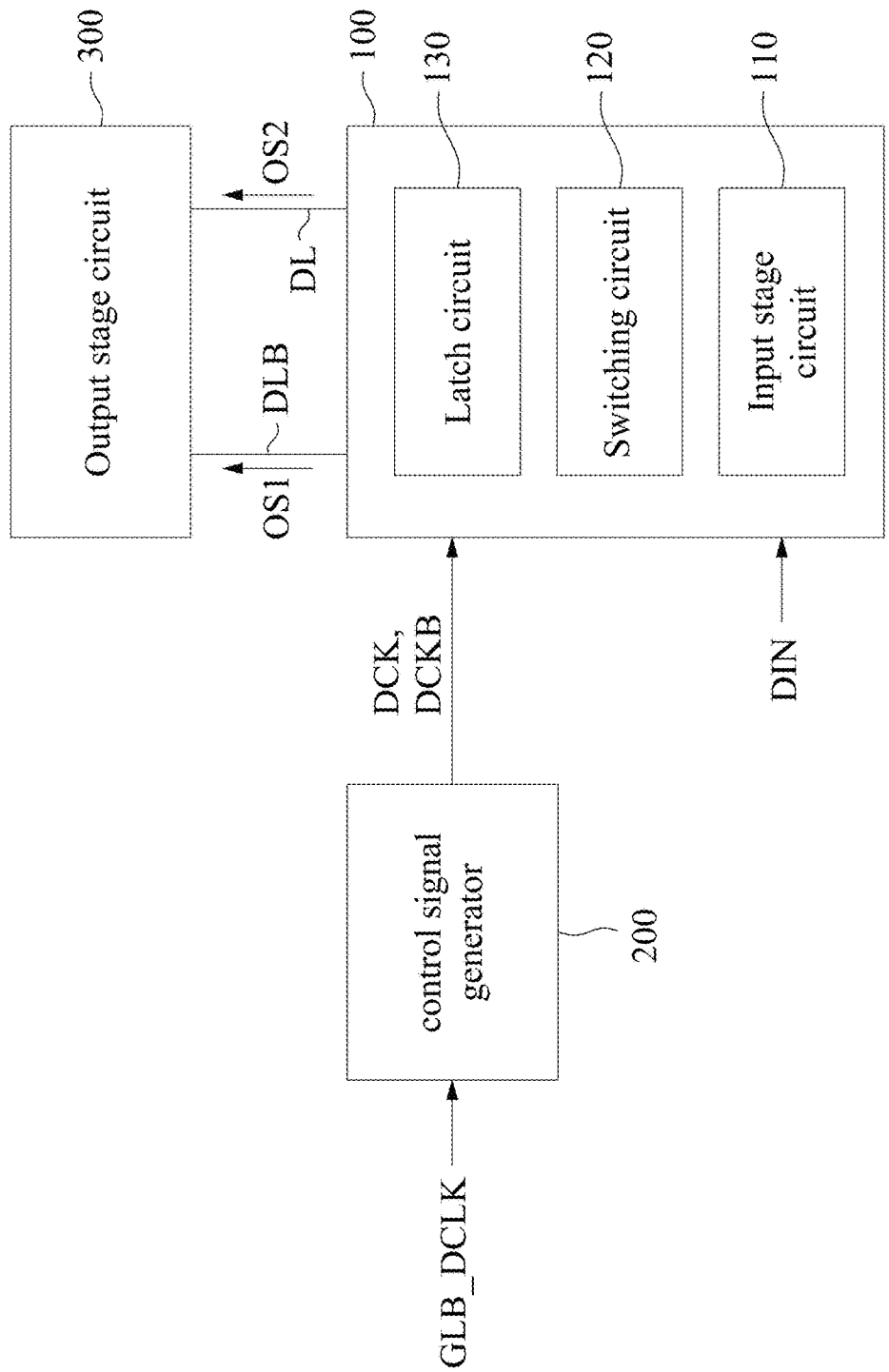
FIG. 1 is a schematic diagram of an integrated circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of an integrated circuit 10, in accordance with some embodiments of the present disclosure. As shown in FIG. 1, the integrated circuit 10 includes a sense amplifier 100, a control signal generator 200, and an output stage circuit 300. For illustration, the sense amplifier 100 is coupled to the output stage circuit 300 through data lines DL and DLB. In some embodiments, the sense amplifier 100 includes an input stage circuit 110, a switching circuit 120, and a latch circuit 130. The sense amplifier 100 is configured to receive an input signal DIN and to generate output signals OS1-OS2 to the output stage circuit 300 in response to control signals DCK and DCKB. The control signal generator 200 is configured to generate the control signals DCK and DCKB in response to a signal GLB_DCLK. In some embodiments, the signal GLB_DCLK is a clock signal. In another embodiment, the output stage circuit 300 is further coupled to a memory cell (not shown, for example, a static random-access memory) and controls a write/read operation of the memory cell.

Figure 2:
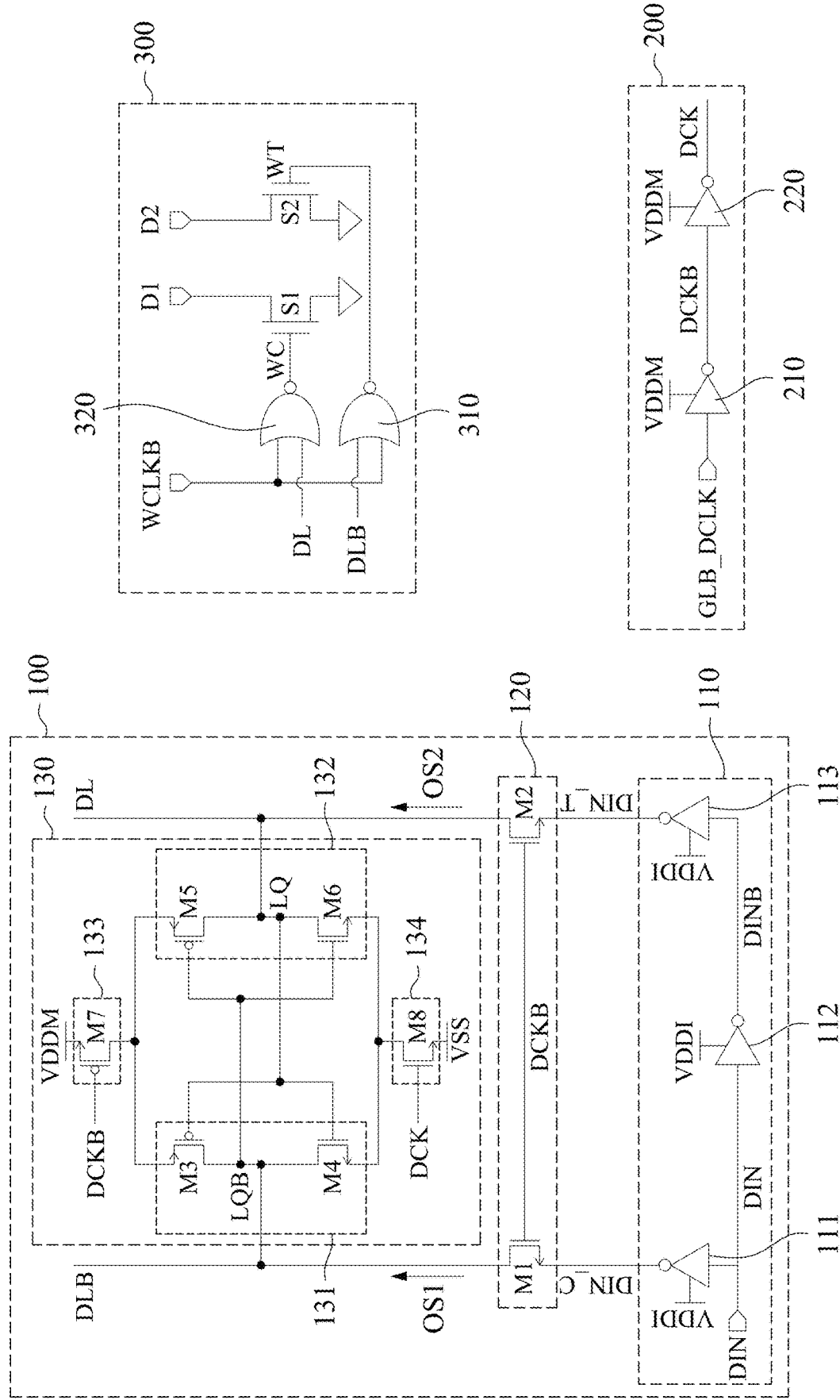
FIG. 2 is a detailed schematic diagram of the integrated circuit of FIG. 1, in accordance with some embodiments of the present disclosure.

Reference is now made to FIG. 2. FIG. 2 is a detailed schematic diagram of the integrated circuit 10 of FIG. 1, in accordance with some embodiments of the present disclosure. For illustration, the input stage circuit 110 is coupled to the switching circuit 120, and the control signal generator 200 is coupled to the latch circuit 130 through the data lines DL and DLB. In operation, the input stage circuit 110 is configured to generate, based on the input signal DIN, input signals DIN_C and DIN_T to the switching circuit 120. The switching circuit 120 is configured to transmit the output signals OS1 and OS2 to the latch circuit 130 through the data lines DL and DLB respectively.

As illustratively shown in FIG. 2, the input stage circuit 110 includes inverters 111-113. The inverter 111 is coupled to an input terminal to receive the input signal DIN. The inverter 112 is coupled between the input terminal and the inverter 113. The inverter 111 is configured to invert the input signal DIN and to output the input signal DIN_C. The inverter 112 is configured to invert the input signal DIN and to output an input signal DINB. The inverter 113 is configured to invert the input signal DINB and to output the input signal DINT. Accordingly, a logic value of the input signals DIN is different from that of the input signals DINB and DIN_C. The input signals DIN_C and DIN_T have different logic values.

For illustration, the switching circuit 120 includes N-type transistors M1-M2, as shown in FIG. 2. For illustration, gate terminals of the transistors M1-M2 are coupled together to receive the control signal DCKB. Source and drain terminals of the transistor M1 are coupled to the inverter 111 and the data line DLB respectively. Similarly, source and drain terminals of the transistor M2 are coupled to the inverter 113 and the data line DL respectively. The configurations of the transistors M1-M2 are given for illustrative purposes. Various implements are within the contemplated scope of the present disclosure. For example, in some embodiments, the source and drain of the transistor M1 switch with each other, and the source and drain of the transistor M2 switch with each other. In some embodiments, when the control signal DCKB has a high logic value, the transistor M1 is turned on to output the output signal OS1 associated with the input signal DIN_C to the data line DLB, and the transistor M2 is turned on to output the output signal OS2 associated with the input signal DINT to the data line DL.

For illustration, the latch circuit 130 is coupled to the data line DLB at a node LQB and coupled to the data line DL at a node LQ. In some embodiments, the latch circuit 130 includes inverters 131-132, a pull up circuit 133 and a pull down circuit 134. The inverters 131-132 are cross coupled between the nodes LQ and LQB. The pull up circuit 133 is coupled between the inverters 131-132 and a voltage terminal VDDM (i.e., referred to as a terminal providing a voltage VDDM), and the pull up circuit 133 is configured to operate in response to the control signal DCKB. The pull down circuit 134 is coupled between the inverters 131-132 and a voltage terminal VSS (i.e., referred to as a terminal providing a voltage VSS, in some embodiments, being a ground), and the pull down circuit 134 is configured to operate in response to the control signal DCK.

Specifically, in some embodiments, the inverter 131 includes transistors M3-M4. The inverter 132 includes transistors M5-M6. The pull up circuit 133 includes a transistor M7. The pull down circuit 134 includes a transistor M8. In some embodiments, the transistors M4, M6, and M8 are N-type transistor. The transistors M3, M5, and M7 are P-type transistor. For illustration, source terminals of the transistors M3 and M5 are coupled to a drain terminal of the transistor M7, and a source terminal of the transistor M7 is coupled to the voltage terminal VDDM. Drain terminals (i.e., referred to as an output terminal of the inverter 131) of the transistors M3 and M4 are coupled together at the node LQB. Gate terminals (i.e., referred to as an input terminal of the inverter 131) of the transistors M3 and M4 are coupled together at the node LQ. Drain terminals (i.e., referred to as an output terminal of the inverter 132) of the transistors M5 and M6 are coupled together at the node LQ. Gate terminals (i.e., referred to as an input terminal of the inverter 132) of the transistors M5 and M6 are coupled together at the node LQB. Source terminals of the transistors M4 and M6 are coupled to a drain terminal of the transistor M8, and a source terminal of the transistor M8 is coupled to the voltage terminal VSS.

The control signal generator 200 includes inverters 210-220. In some embodiments, the inverter 210 is configured to invert the signal GLB_DCLK to generate the control signal DCKB. The inverter 220 is configured to invert the control signal DCKB to generate the control signal DCK. Accordingly, the control signals DCK and DCKB have different logic values, and the signal GLB_DCLK and the control signal DCK have the same logic value.

The output stage circuit 300 includes NOR gates 310-320. For illustration, the NOR gate 310 has a first terminal coupled with the data line DLB and a second terminal receiving a control signal WCLKB. The NOR gate 310 is configured to perform a logic NOR operation to generate a signal WC to control a transistor S1 which is coupled to a terminal D1. Similarly, the NOR gate 320 has a first terminal coupled with the data line DL and a second terminal receiving the control signal WCLKB. The NOR gate 320 is configured to perform a logic NOR operation to generate a signal WT to control a transistor S2 which is coupled to a terminal D2. In some embodiments, the terminals D1-D2 are coupled to a bit line and bit line bar (not shown) that are coupled to a memory cell. In some embodiments, the control signal WCLKB is a clock signal.

In some embodiments, the input stage circuit 110 in the sense amplifier 100 operates with the voltage VDDI (in VDDI voltage domain) while the switching circuit 120 and the latch circuit 130 of the sense amplifier 100, the control signal generator 200, and the output stage circuit 300 operate with the voltage VDDM (in VDDM voltage domain.) In some embodiments, the voltage VDDI is substantially lower than the voltage VDDM. For example, the voltage VDDI is about 0.45 Volts and the voltage VDDM is about 0.84 Volts. Alternatively, in some another embodiment, the voltage VDDI is substantially higher than the voltage VDDM. For example, the voltage VDDI is about 0.84 Volts and the voltage VDDM is about 0.45 Volts. In still another embodiment, the voltage VDDI is substantially equal to the voltage VDDM.

In some embodiments, the sense amplifier 100 operates to sense the states of the data lines DL and DLB, and is referred to as a mid-level sensing like circuit.

The configurations of FIGS. 1-2 are given for illustrative purposes. Various implements are within the contemplated scope of the present disclosure. For example, in some embodiments, the voltage VDDI ranges from about 0.3 Volts to about 1.15 Volts, and the voltage VDDM ranges from about 0.6 Volts to about 1.15 Volts. In various embodiments, the voltage VDDM is smaller than about 0.6 Volts and the voltage VDDI is greater than about 1.15 Volts.

Figure 3:
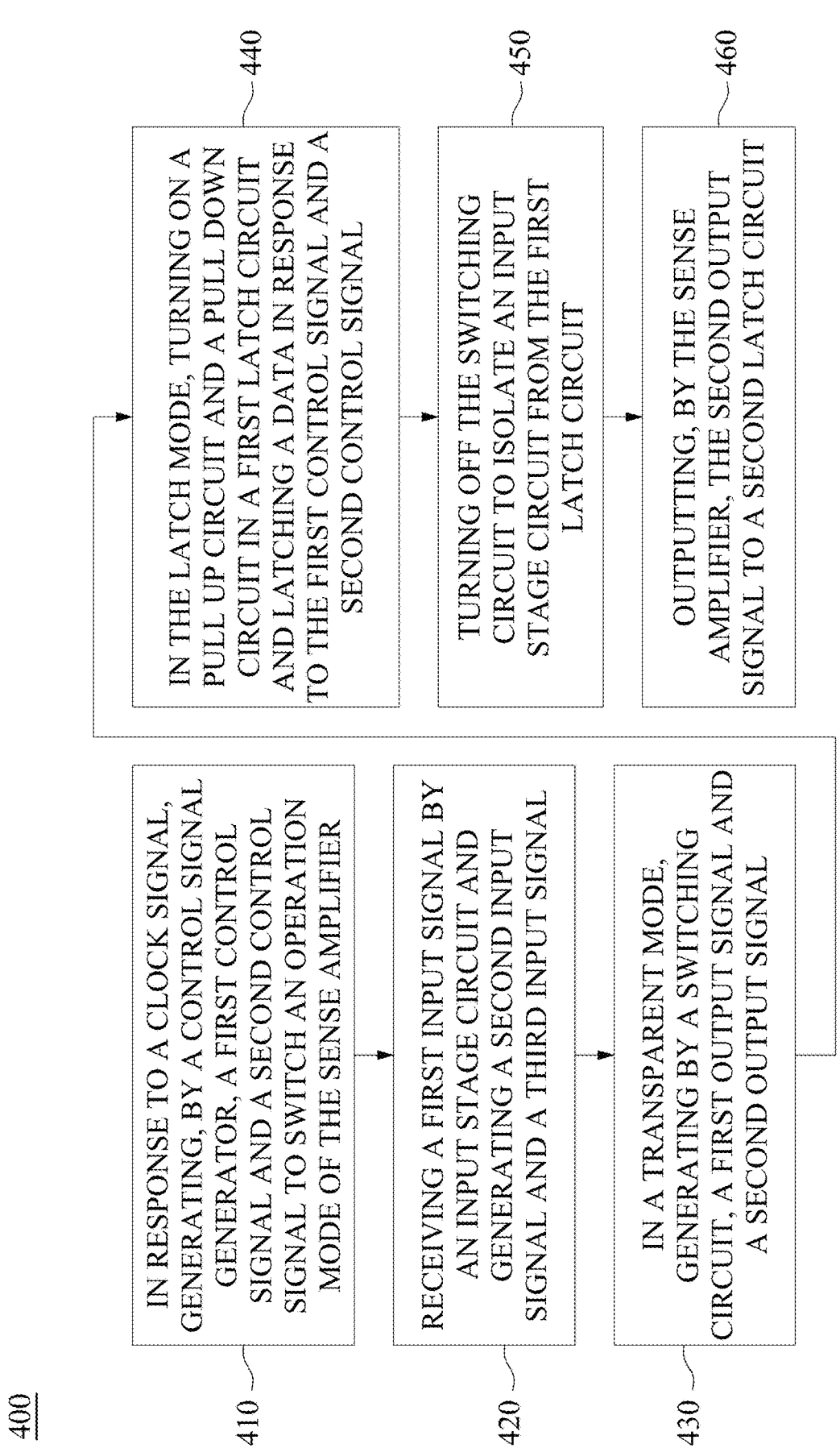
FIG. 3 is a flowchart of a method for operating the integrated circuit in FIGS. 1-2, in accordance with some embodiments of the present disclosure.
Figure 4A:
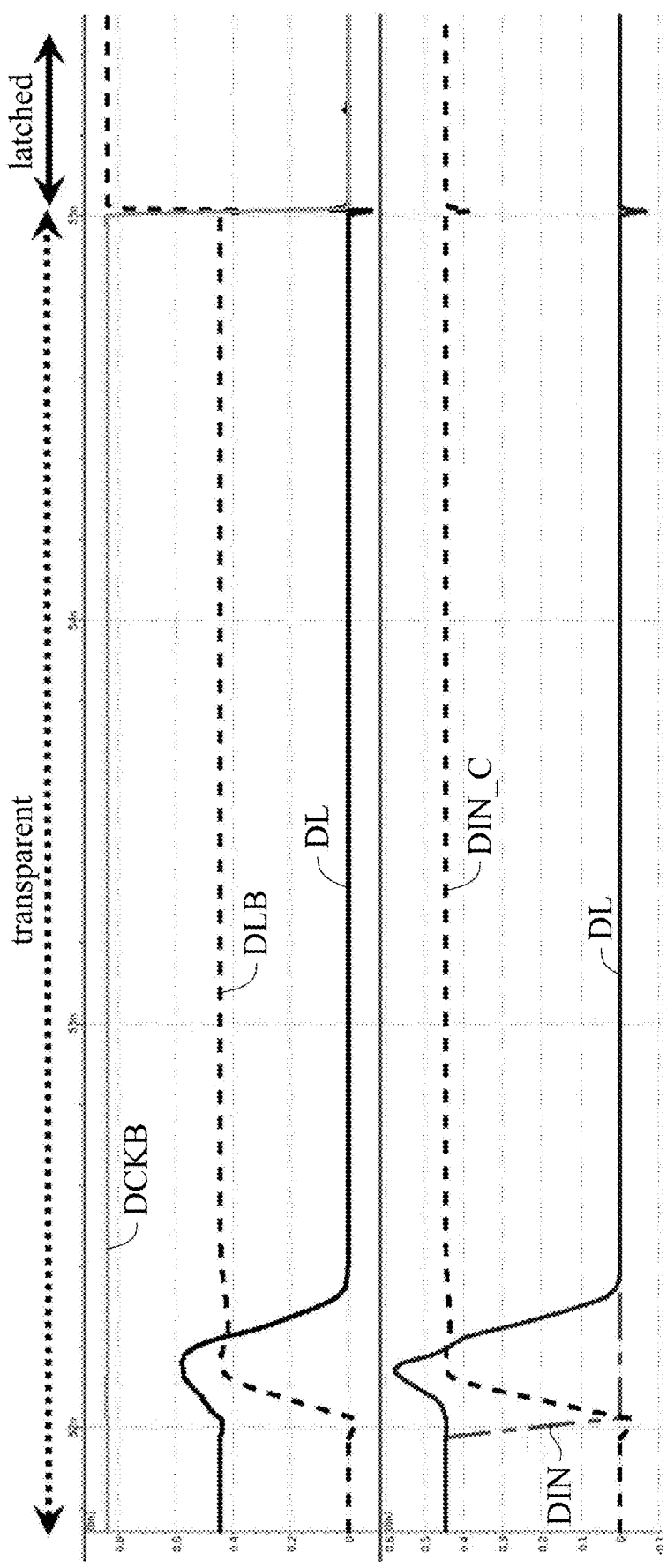
FIGS. 4A-4B illustrate waveforms of signals in the integrated circuit in FIGS. 1-2 operating corresponding to the method in FIG. 3, in accordance with some embodiments of the present disclosure.
Figure 4B:
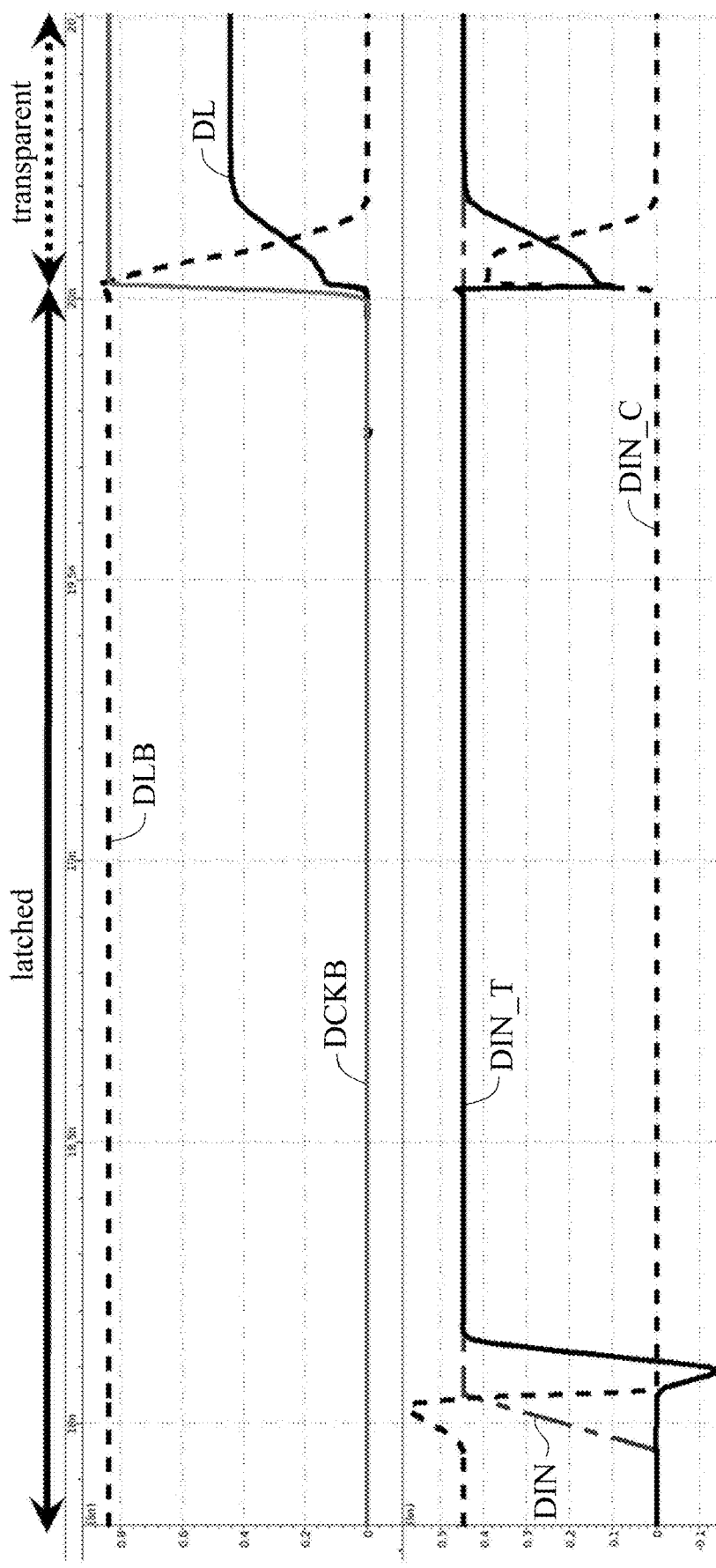

Reference is now made to FIG. 3. FIG. 3 is a flowchart of a method 400 for operating the integrated circuit in FIGS. 1-2, in accordance with some embodiments of the present disclosure. It is understood that additional operations can be provided before, during, and after the processes shown by FIG. 3, and some of the operations described below can be replaced or eliminated, for additional embodiments of the method. The order of the operations/processes may be interchangeable. Throughout the various views and illustrative embodiments, like reference numbers are used to designate like elements. The method 400 includes operations 410-460 that are described below with reference to the integrated circuit 10 and waveforms shown in FIGS. 4A-4B, in accordance with various embodiments. FIGS. 4A-4B illustrate waveforms of signals in the integrated circuit in FIGS. 1-2 operating corresponding to the method in FIG. 3, in accordance with some embodiments of the present disclosure. In the embodiments of FIGS. 4A-4B, the voltage level VDDM is about 0.84 Volts, and the voltage level VDDI is about 0.45 Volts.

In operation 410, the control signal generator 200 generates, in response to the signal GLB_DCLK, the control signals DCK and DCKB to switch an operation mode of the sense amplifier 100. As shown in the embodiments of FIG. 4A, the control signal DCKB has a high logic value with the voltage level VDDM. Accordingly, the transistors M1-M2 are turned on and the sense amplifier 100 operates in the transparent mode.

In operation 420, the input stage circuit 110 receives the input signal DIN and generates the input signal DIN_C to the transistor M1 and the input signal DINT to the transistor M2. As in the embodiments of shown FIG. 4A, a voltage level of the input signal DIN falls from the voltage level VDDI to 0 Volt as inputted into the input stage circuit 110. Correspondingly, the inverted input signal DIN_C turns to have the voltage level VDDI and the inverted input signal DINT, based on the input signal DINB of FIG. 2, is 0 Volt. Alternatively stated, the input signals DIN, DIN_C, and DIN_T have logic "0", "1", and "0" separately.

In operation 430, in the transparent mode, the switching circuit 120 is turned on in response to the control signal DCKB (having a high logic value, i.e., "1") and generates the output signal OS1 by the transistor M1 to the data line DLB and the output signal OS2 by the transistor M2 to the data line DL, as shown in FIG. 2.

The output signal OS1 is associated with the input signal DIN_C and the output signal OS2 is associated with the input signal DIN_T. Specifically, with reference to FIGS. 2 and 4A, when the transistor M1 is turned on, the data line DLB is charged from 0 Volts to about 0.42 Volts according to the input signal DIN_C. Similarly, the transistor M2 is turned on, and the data line DL is discharged to 0 Volts according to the input signal DIN_T. Alternatively stated, the switching circuit 120 adjusts the voltage level of the data line DLB according to the input signal DIN_C and the voltage level of the data line DL according to the input signal DIN_T.

Furthermore, in the transparent mode, with reference to FIG. 2, the P-type transistor M7 of the pull up circuit 133 is turned off in response to the control signal DCKB (having a logic "1") and the N-type transistor M8 of the pull down circuit 134 is turned off in response to the control signal DCK (having a logic "0".) Therefore, the latch circuit 130 does not have supply voltage and is configured to be as a capacitor.

In some embodiments, the method 400 further includes the operations of generating, by the output stage circuit 300, the disabled signals WC and WT in response to the control signal WCLKB. For illustration, with reference to FIG. 2, in the transparent mode, the control signal WCLKB has a high logic value (i.e., a solid high logic value "1".) Accordingly, regardless of the logic values of the output signals OS1-OS2 transmitted in the data lines DL and DLB, the signals WC and WT have the logic "0" and the memory cell (not shown) coupled to the terminals D1-D2 does not operate in response to the output signals OS1-OS2. Alternatively stated, in the transparent mode, the NOR gates 310-320 are configured to form a power boundary and keep the output stage circuit 300 at a standby mode.

As shown in FIG. 4A, when the voltage level of the control signal DCKB drops and turns to be a low voltage level (i.e., logic "0"), the sense amplifier 100 is switched to operate in the latch mode. In operation 440, the pull up circuit 133 and the pull down circuit 134 are turned on in response to the control signal DCKB (having a logic "1") and control signal DCK (having a logic "0".) The transistor M3 is turned on and the transistor M4 is turned off in response to the received voltage level of 0 Volts from the node LQ at the gate terminals thereof. The pull up circuit 133 transmits the voltage VDDM to the node LQB and pulls up the voltage level of the node LQB. Accordingly, in the embodiments of FIG. 4A, the voltage level of the data line DLB rises to have the voltage VDDM, that is, about 0.84 Volts. Similarly, the transistor M5 is turned off and the transistor M6 is turned on in response to the received voltage level of 0.84 Volts from the node LQB at the gate terminals thereof. The pull up circuit 134 couples the LQ to the voltage terminal VSS (i.e., a ground) and keeps the node LQ having 0 Volts. Accordingly, the voltage level of the data line DL keeps at 0 Volts.

Based on the discussion above, the sense amplifier 100 is configured to be a data latch circuit. Specifically, the inverters 131-132 in the latch circuit 130 are configured to latch a logic data "0" at the node LQ based on the voltage level of the data line DL and to latch a logic data "1" at the node LQB based on the voltage level of the data line DL.

Furthermore, the sense amplifier 100 is configured to be a level shifter. In some embodiments, the voltage level of the data line DL changes from the voltage VDDI to the voltage VDDM. Alternatively stated, a voltage swing of the output signal OS1 is adjusted and pulled to full range by the sense amplifier 100. For illustration, the full range of the voltage swing is configured from a voltage VSS which is, for example, a ground voltage, to the voltage VDDM. Specifically, the maximum voltage of the input signal DIN is the voltage VDDI. Correspondingly, in the transparent mode, the voltage swing of the output signals OS1-OS2 is from the voltage VSS to the voltage VDDI. In the latch mode, the sense amplifier 100 is further able to adjust the maximum voltage of the output signals OS1-OS2 to be the voltage VDDM, in which the voltage VDDM is different from the voltage VDDI. Effectively, the driving ability of the integrated circuit 10 is increased by the sense amplifier 100.

Continued reference to FIGS. 2-3 and further to FIG. 4B, in operation 450, the switching circuit 120 is turned off in response to the control signal DCKB having the logic "0" in the latch mode. Because the transistors M1-M2 are turned off, the data lines DL and DLB and the latch circuit 130 are isolated from the input stage circuit 110. As shown in FIG.

4B, when the input signal DIN toggles in the latch mode, the voltage levels of the data lines DL and DLB remain the same without being disturbed. Accordingly, the logic data is latched safely in the latch circuit 130.

With continued reference to FIG. 4B, when the control signal DCKB rises to have a high voltage level (i.e., logic "1"), the sense amplifier 100 turns to operate in the transparent mode. As shown in FIG. 4B, the voltage level of the data line DLB drops as the voltage level of the input signal DIN_C is low, and the voltage level of the data line DL increases as the input signal DIN_T charges the data line DL.

To sum up, with the configurations of the present disclosure, the sense amplifier transfers voltage domains of power rails and simultaneously latches data without utilizing a traditional level shifter and a latch circuit. Less area cost for those circuits, lower active power and leakage consumption are provided by the present disclosure, compared with some approaches which suffer from much area penalty.

Moreover, in some approaches, the level shifter fails to propagate an output (power) signal when there is a great gap between levels of the voltages VDDI and VDDM. For example, the voltage VDDI is about 0.3 Volts and the VDDM is about 1.15 Volts. In contrast, with the configurations of the present disclosure, based on some experimental results, the sense amplifier is capable to propagate output signal with the maximum of the voltage VDDM when the great gap between the levels of the voltages VDDI and VDDM exists.

According to the configurations of the present disclosure, voltages are transmitted to both of the data lines DL and DLB based on the input signals DIN_C and DIN_T. Accordingly, a large difference of voltage between the data lines DL and DLB is designed for providing a greater tolerance of process variation and mismatch of the data lines DL and DLB, while in some approaches large sizing of the data lines is utilized for covering the process variation and mismatch.

The configurations of FIGS. 3-4B are given for illustrative purposes. Various implements are within the contemplated scope of the present disclosure. For example, in some embodiments, the voltage VDDI ranges from about 0.3 Volts to about 1.15 Volts, and the voltage VDDM ranges from about 0.6 Volts to about 1.15 Volts.

Figure 5A:
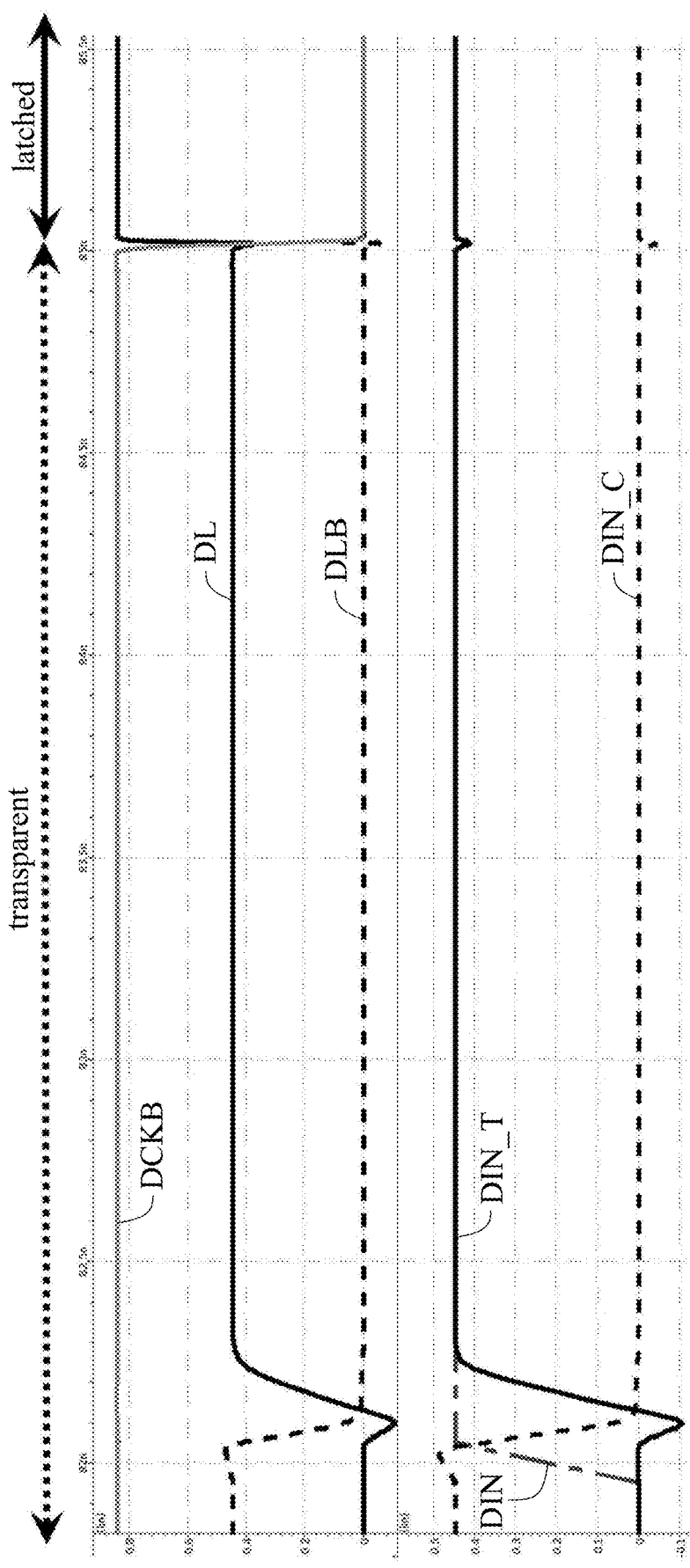
FIGS. 5A-5B illustrate waveforms of signals in the integrated circuit in FIGS. 1-2 operating corresponding to the method in FIG. 3, in accordance with other embodiments of the present disclosure.
Figure 5B:
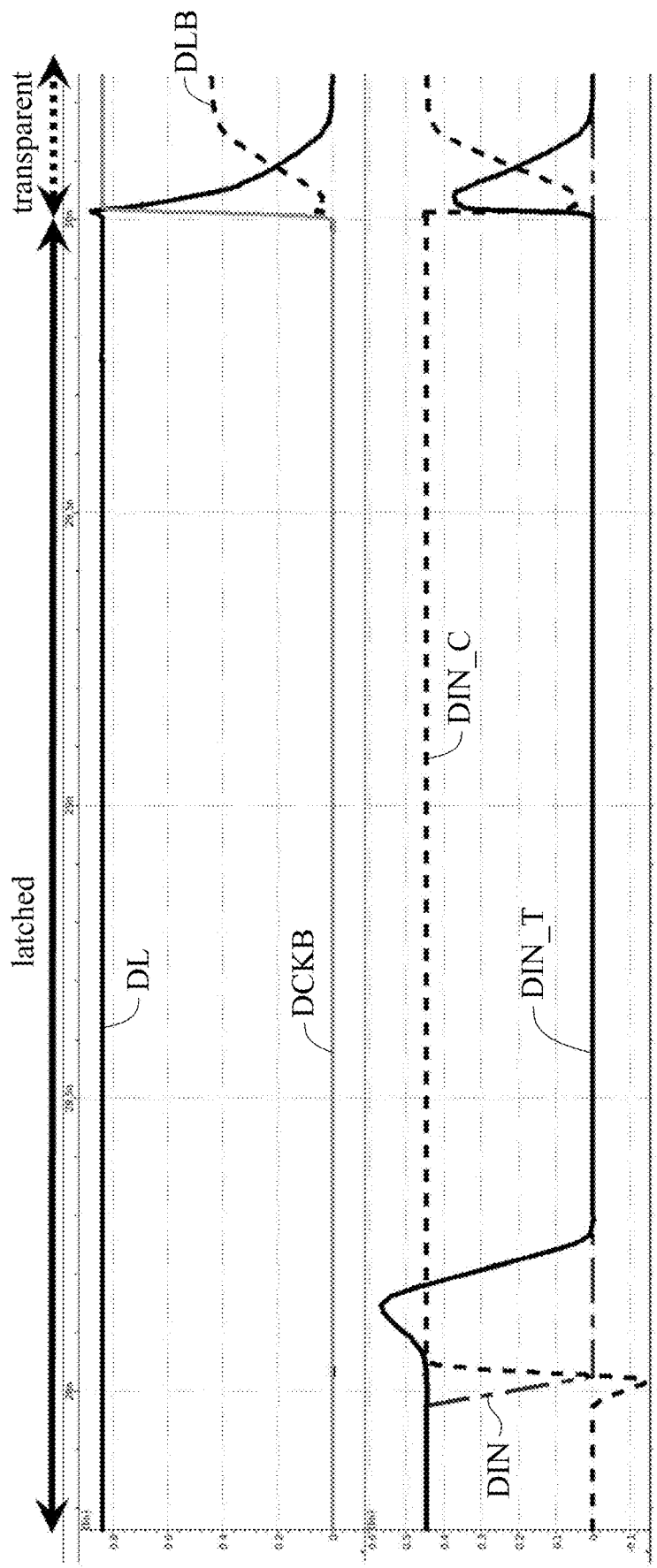

Reference is now made to FIGS. 5A-5B. FIGS. 5A-5B illustrate waveforms of signals in the integrated circuit 10 in FIGS. 1-2 operating corresponding to the method in FIG. 3, in accordance with other embodiments of the present disclosure. In the embodiments of FIGS. 5A-5B, the voltage level VDDM is about 0.84 Volts, and the voltage level VDDI is about 0.45 Volts. With respect to the embodiments of FIGS. 1-4B, like elements in FIGS. 5A-5B are designated with the same reference numbers for ease of understanding. The specific operations of similar elements, which are already discussed in detail in above paragraphs, are omitted herein for the sake of brevity.

Compared with FIG. 4A, in the transparent mode, instead of falling to 0 Volt, the voltage level of the input signal DIN rises from 0 Volt to the voltage level VDDI as inputted into the input stage circuit 110. Correspondingly, the inverted input signal DIN_C turns to be 0 Volts, and the input signal DINT, based on the input signal DINB of FIG. 2, has the voltage level VDDI. Alternatively stated, the input signals DIN, DIN_C, and DINT have logic "1", "0", and "1" separately. When the control signal DCKB has the high logic value (i.e., "1") the data line DLB is discharged from about 0.42 Volts to about 0 Volt according to the input signal DIN_C, and similarly, the data line DL is charged to 0.42 Volts according to the input signal DIN_T.

As shown in FIG. 5A, in the latch mode, when the voltage level of the control signal DCKB drops and turns to be the low voltage level (i.e., logic "0") the voltage level of the data line DL rises to have the voltage VDDM and the voltage level of the data line DLB remains at 0 Volts. Accordingly, the latch circuit 130 latches the logic data "1" at the node LQ based on the voltage level of the data line DL and to latch a logic data "0" at the node LQB based on the voltage level of the data line DL.

In some embodiments, as shown in FIG. 5B, in the latch mode, when the input signal DIN toggles in the latch mode to go low, the voltage levels of the data lines DL and DLB remain the same without being disturbed. When the control signal DCKB rises to have the high voltage level (i.e., logic "1"), the sense amplifier 100 turns to operate in the transparent mode. As shown in FIG. 5B, the voltage level of the data line DL dropping follows the falling of the voltage level of the input signal DIN_T, and the voltage level of the data line DLB increasing follows the raising of the voltage level of the input signal DIN_C.

Figure 6A:
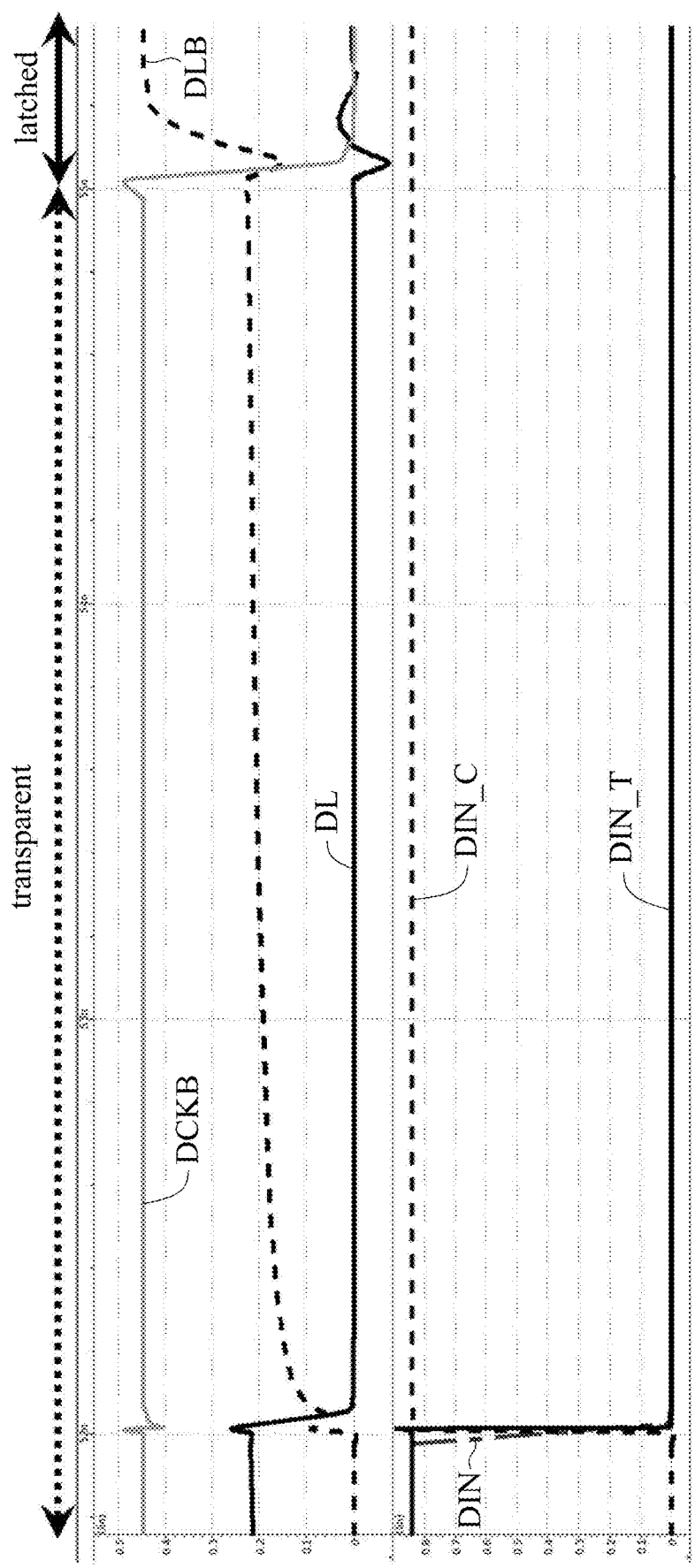
FIGS. 6A-6B illustrate waveforms of signals in the integrated circuit in FIGS. 1-2 operating corresponding to the method in FIG. 3, in accordance with other embodiments of the present disclosure.
Figure 6B:
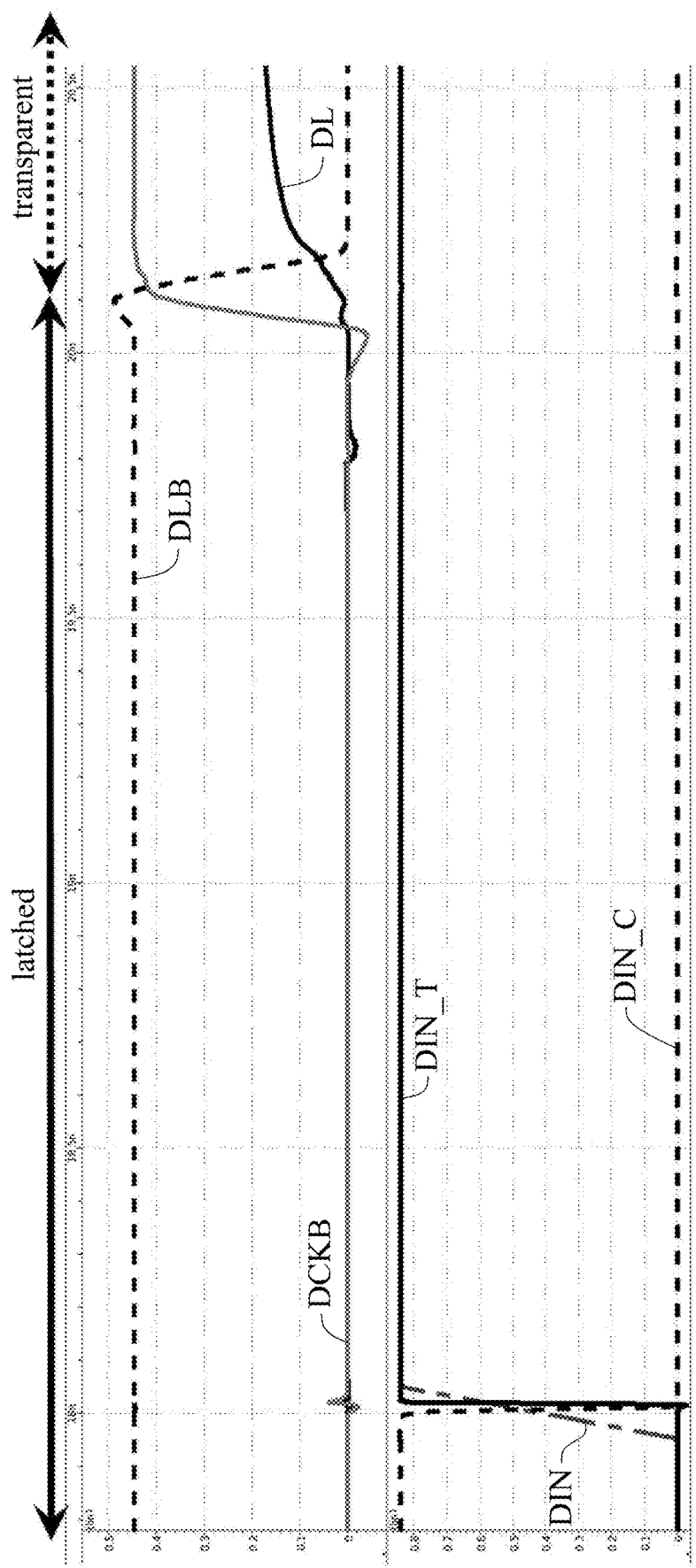

Reference is now made to FIGS. 6A-6B. FIGS. 6A-6B illustrate waveforms of signals in the integrated circuit 10 in FIGS. 1-2 operating corresponding to the method in FIG. 3, in accordance with other embodiments of the present disclosure. With respect to the embodiments of FIGS. 1-5B, like elements in FIGS. 6A-6B are designated with the same reference numbers for ease of understanding.

Compared with FIG. 4A, instead of the voltage VDDM being larger than the voltage VDDI, in the embodiments of FIGS. 6A-6B, the voltage level VDDM is about 0.45 Volts and smaller than the voltage level VDDI being about 0.84 Volts. As shown in FIG. 6A, the voltage level of the input signal DIN drops from the voltage level VDDI to 0 Volt as inputted into the input stage circuit 110. Correspondingly, the inverted input signal DIN_C turns to have the voltage level VDDI, and the input signal DINT, based on the input signal DINB of FIG. 2, is 0 Volt. Alternatively stated, the input signals DIN, DIN_C, and DIN_T have logic "0", "1", and "0" separately. When the control signal DCKB has the high logic value (i.e., "1") the data line DL is discharged from about 0.2 Volts to about 0 Volt according to the input signal DIN_T, and similarly, the data line DLB is charged to 0.2 Volts according to the input signal DIN_C. In some embodiments, the maximum of voltage level of the data line DLB equals to a voltage of VDDM-Vth, in which the voltage Vth is a threshold voltage of the transistor M1.

Moreover, when the threshold voltage Vth equals to about 0.2 Volts and the voltage VDDM equals to 0.45 Volts, a minimum voltage difference between the data lines DB and DLB is about 0.23 Volts. Accordingly, the designed voltage difference between the data lines DB and DLB covers the voltage fluctuation caused by the process variation and mismatch, and the reliability of the sense amplifier 100 increases.

As shown in FIG. 6A, in the latch mode, when the voltage level of the control signal DCKB drops and turns to be the low voltage level (i.e., logic "0") the voltage level of the data line DLB rises to have the voltage VDDM (i.e., about 0.45 Volts) and the voltage level of the data line DL remains at 0 Volts. Accordingly, the latch circuit 130 latches the logic data "0" at the node LQ based on the voltage level of the data line DL and to latch a logic data "1" at the node LQB based on the voltage level of the data line DL.

In some embodiments, as shown in FIG. 6B, in the latch mode, when the input signal DIN toggles in the latch mode to go high, the voltage levels of the data lines DL and DLB remain the same without being disturbed. When the control signal DCKB rises to have the high voltage level (i.e., logic "1"), the sense amplifier 100 turns to operate in the transparent mode. As shown in FIG. 6B, the data line DLB is discharged as the voltage level of the input signal DIN_C is low. The voltage level of the data line DL is gradually charged as the voltage level of the input signal DIN_T is high.

Figure 7A:
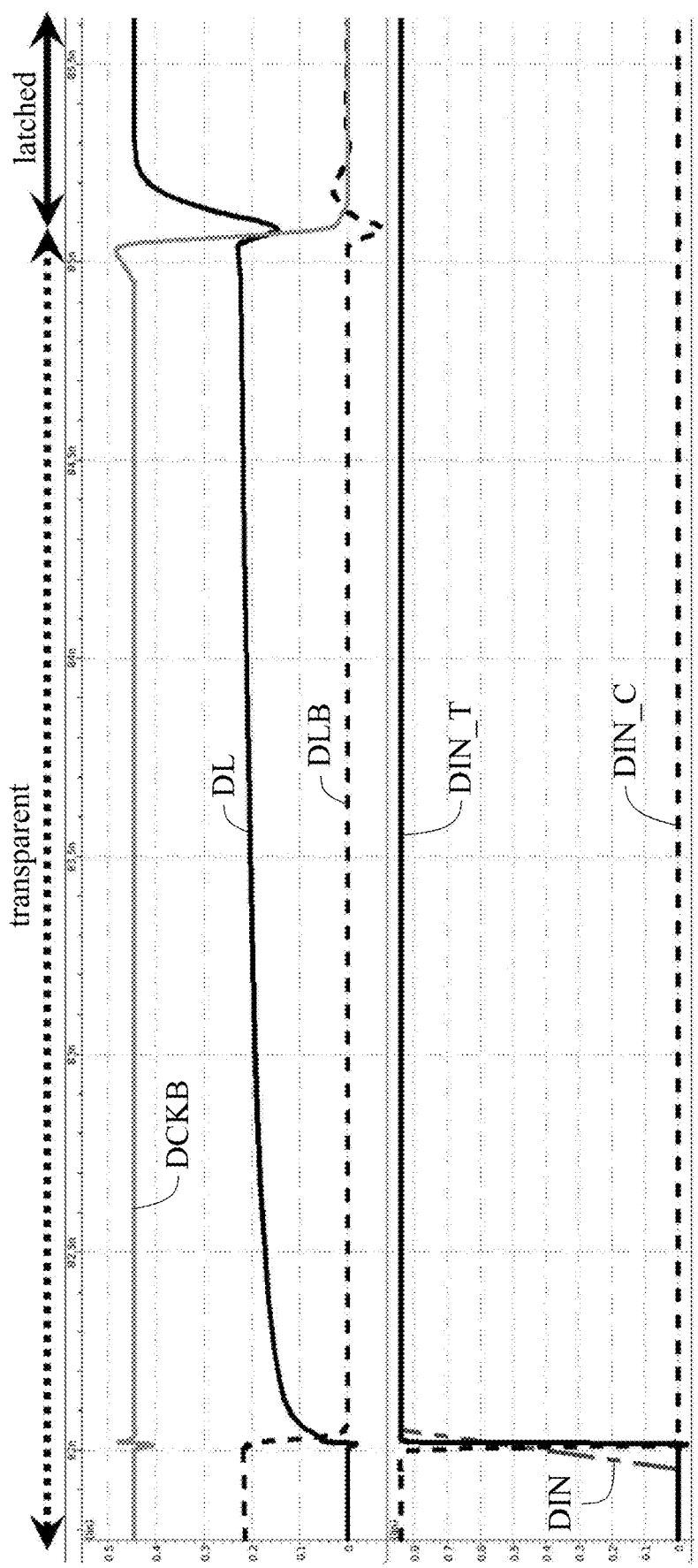
FIGS. 7A-7B illustrate other waveforms of signals in the integrated circuit in FIGS. 1-2 operating corresponding to the method in FIG. 3, in accordance with other embodiments of the present disclosure.
Figure 7B:
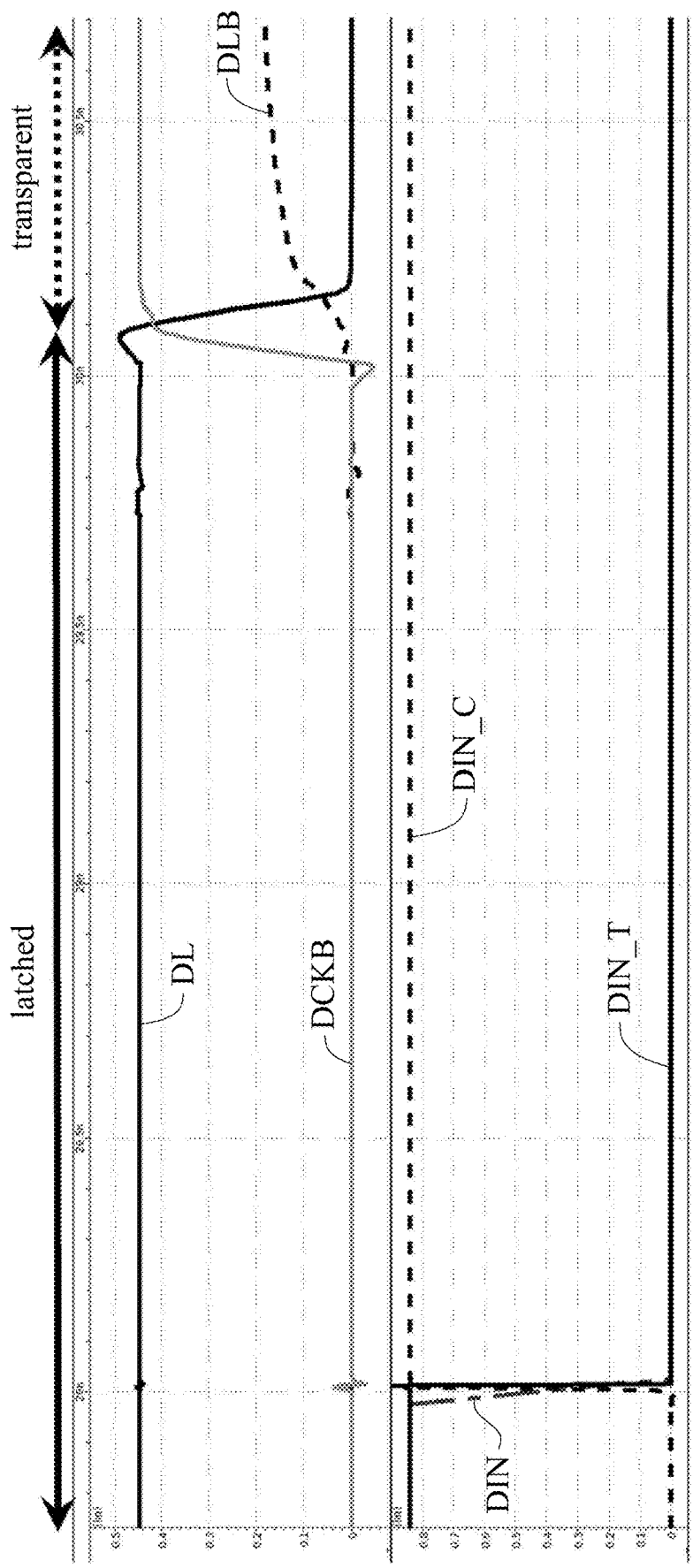

Reference is now made to FIGS. 7A-7B. FIGS. 7A-7B illustrate waveforms of signals in the integrated circuit 10 in FIGS. 1-2 operating corresponding to the method in FIG. 3, in accordance with other embodiments of the present disclosure. With respect to the embodiments of FIGS. 1-6B, like elements in FIGS. 7A-7B are designated with the same reference numbers for ease of understanding.

Compared with FIG. 6A, instead of the voltage level of the input signal DIN dropping, the voltage level of the input signal DIN rises from 0 Volt to the voltage level VDDI as inputted into the input stage circuit 110. Correspondingly, the inverted input signal DIN_C turns to be 0 Volt, and the input signal DIN_T, based on the input signal DINB of FIG. 2, has the voltage level VDDI. Alternatively stated, the input signals DIN, DIN_C, and DIN_T have logic "1", "0", and "1" separately. When the control signal DCKB has the high logic value (i.e., "1") the data line DLB is discharged from about 0.2 Volts to about 0 Volt according to the input signal DIN_C, and similarly, the data line DL is charged to 0.2 Volts according to the input signal DIN_T. In some embodiments, the maximum of voltage level of the data line DL equals to a voltage of VDDM-Vth, in which the voltage Vth is a threshold voltage of the transistor M2.

As shown in FIG. 7A, in the latch mode, when the voltage level of the control signal DCKB drops and turns to be the low voltage level (i.e., logic "0") the voltage level of the data line DL rises to have the voltage VDDM (i.e., about 0.45 Volts) and the voltage level of the data line DLB remains at 0 Volts. Accordingly, the latch circuit 130 latches the logic data "1" at the node LQ based on the voltage level of the data line DL and to latch a logic data "0" at the node LQB based on the voltage level of the data line DL.

In some embodiments, as shown in FIG. 7B, in the latch mode, when the input signal DIN toggles in the latch mode to go low, the voltage levels of the data lines DL and DLB remain the same without being disturbed. When the control signal DCKB rises to have the high voltage level (i.e., logic "1"), the sense amplifier 100 turns to operate in the transparent mode. As shown in FIG. 7B, the data line DL is discharged as the voltage level of the input signal DIN_T is low. The voltage level of the data line DLB is gradually charged as the voltage level of the input signal DIN_C is high.

Figure 8:
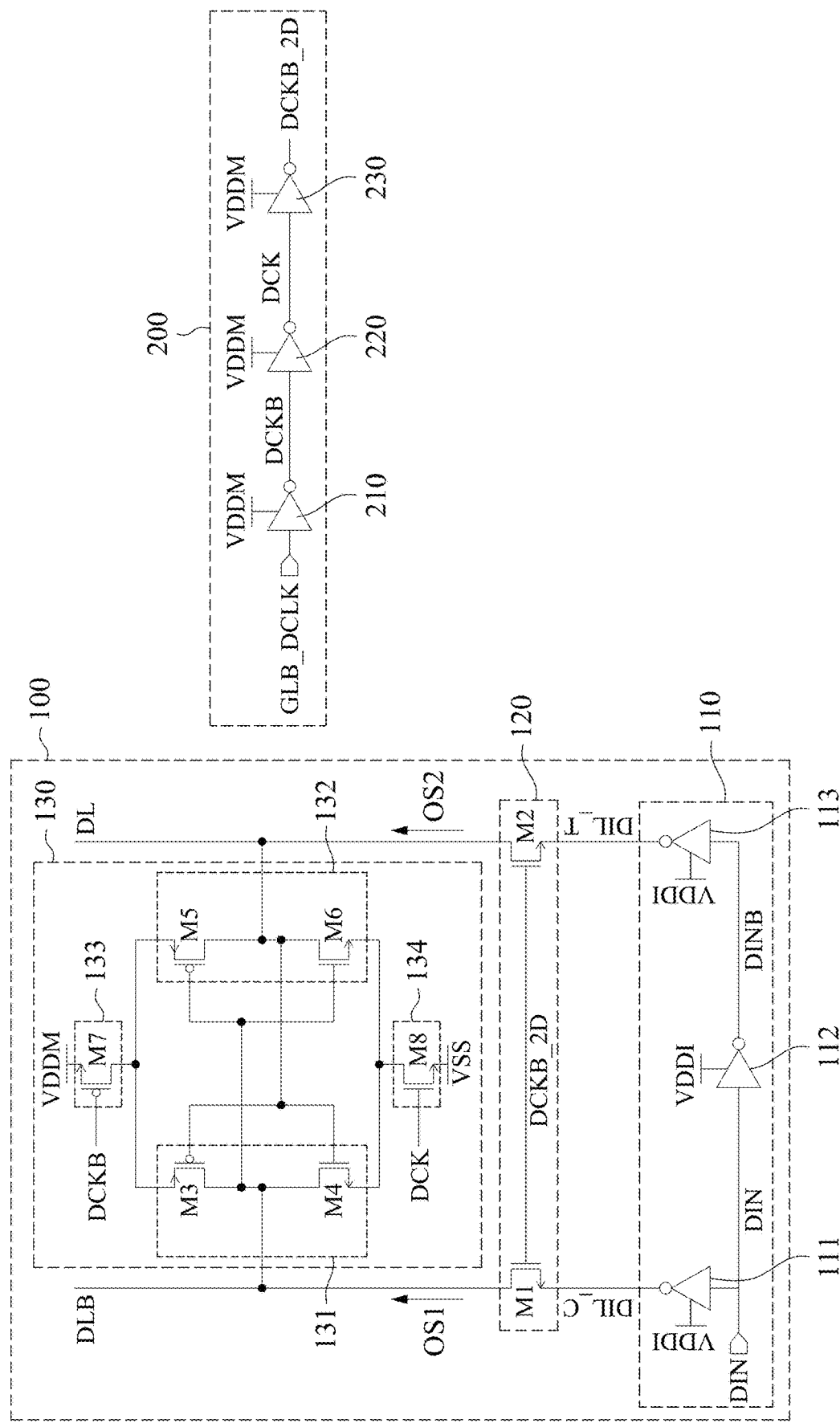
FIG. 8 is a detailed schematic diagram of the integrated circuit of FIG. 1, in accordance with other embodiments of the present disclosure.

Reference is now made to FIG. 8. FIG. 8 is a detailed schematic diagram of the integrated circuit 10 of FIG. 1, in accordance with other embodiments of the present disclosure. With respect to the embodiments of FIGS. 1-7B, like elements in FIG. 8 are designated with the same reference numbers for ease of understanding.

Compared with FIG. 2, the control signal generator 200 in FIG. 8 further includes an inverter 230 coupled at the output of the inverter 220. The inverter 230 is configured to invert the control signal DCK to output the control signal DCLK_2D. Accordingly, the control signals DCKB and DCLK_2D have the same logic value.

With continued reference to FIG. 8, instead of the switching circuit 120 operating in response to the control signal DCKB as shown in FIG. 2, the switching circuit 120 in FIG. 8 is configured to operate in response to a control signal DCLK_2D.

Figure 9:
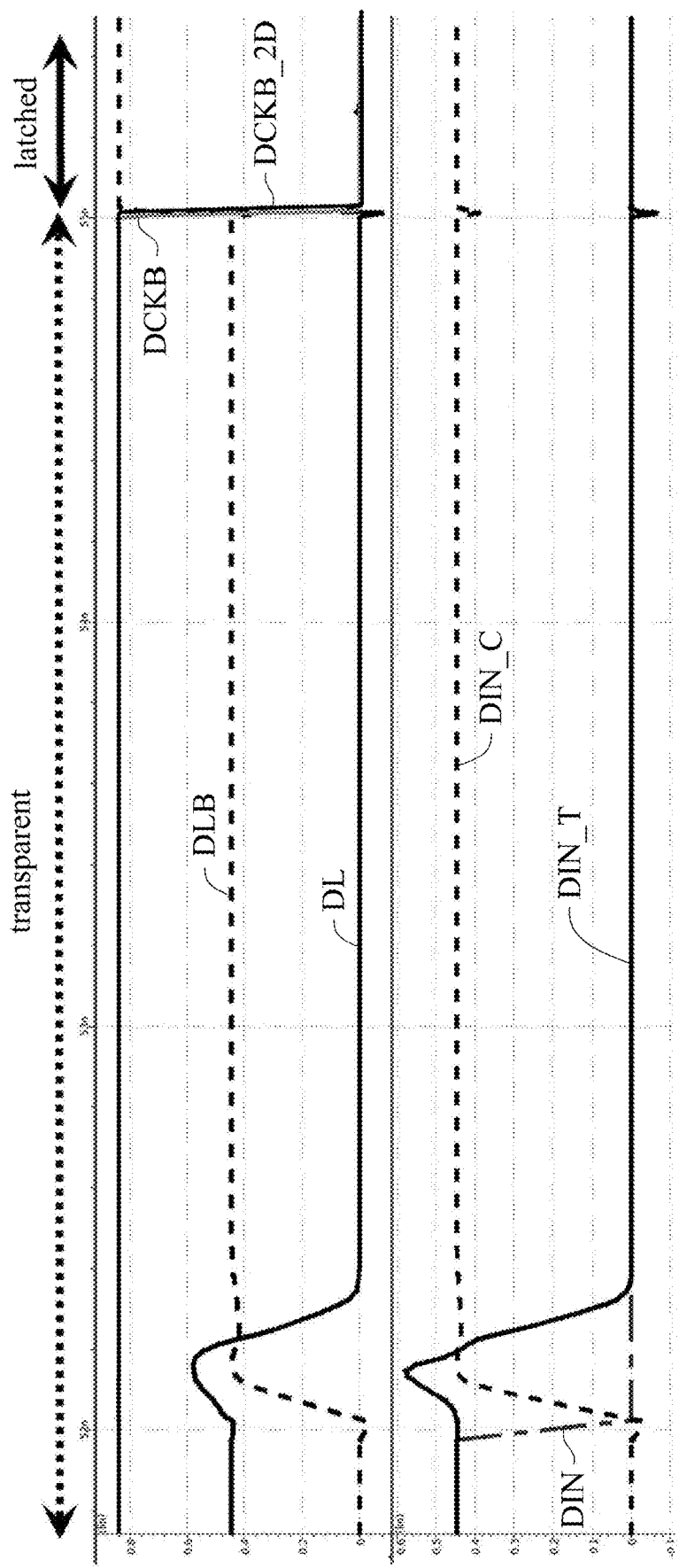
FIG. 9 illustrates waveforms of signals in the integrated circuit in FIG. 8 operating corresponding to the method in FIG. 3, in accordance with some embodiments of the present disclosure.

Reference is now made to FIG. 9. FIG. 9 illustrates waveforms of signals in the integrated circuit in FIG. 8 operating corresponding to the method in FIG. 3, in accordance with some embodiments of the present disclosure. With respect to the embodiments of FIGS. 1-8, like elements in FIG. 9 are designated with the same reference numbers for ease of understanding.

As shown in FIG. 9, the voltage level of the control signal DCKB_2D goes low after the voltage level of the control signal DCKB goes low. For illustration, after the pull up circuit 133 and the pull down circuit 134 are turned on in response to the control signals DCK and DCKB, the transistors M1-M2 in the switching circuit 120 start turning off. Accordingly, one of the data lines DL and DLB is charged to the voltage VDDM without experiencing a floating status when the output signal OS1 or OS2 provided by the switching circuit 120 is cut. The configurations of FIGS. 8-9 provide a safe sensing behavior of the latch circuit 130.

Figure 10:
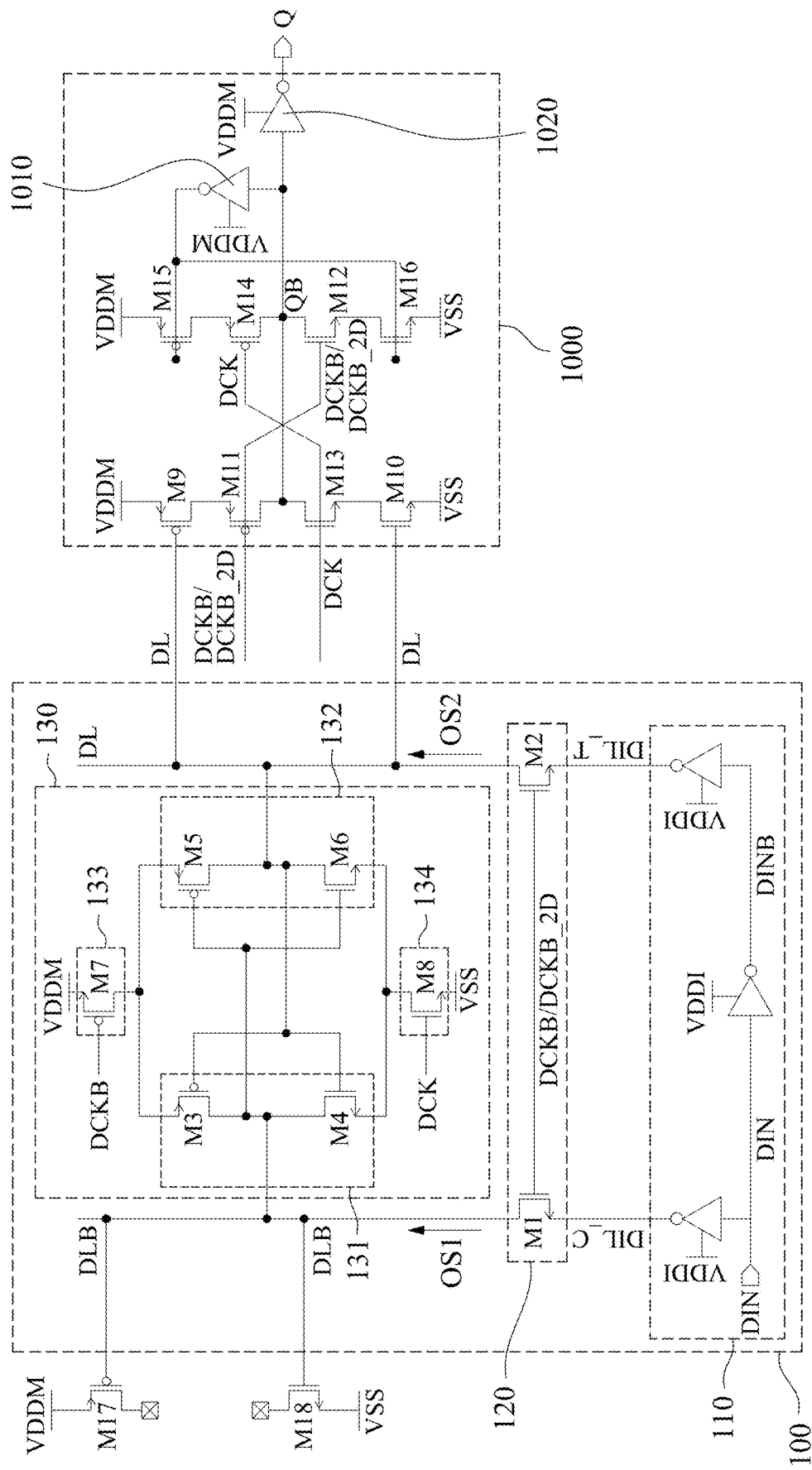
FIG. 10 is a schematic diagram of the integrated circuit of FIG. 2 and a latch circuit, in accordance with some embodiments of the present disclosure.

Reference is now made to FIG. 10. FIG. 10 is a schematic diagram of the integrated circuit of FIG. 2 and a latch circuit 1000, in accordance with some embodiments of the present disclosure. With respect to the embodiments of FIGS. 1-9, like elements in FIG. 10 are designated with the same reference numbers for ease of understanding.

Compared with FIG. 8, the sense amplifier 100 is further coupled to the latch circuit 1000 through the data line DL. In some embodiments, the latch circuit 1000 operates in the VDDM domain. For illustration, the latch circuit 1000 includes transistors M9-M16 and inverters 1010-1020. Gates of the transistors M9-M10 are coupled to the data line DL. A source of the transistor M9 is coupled to the voltage terminal VDDM, and a drain of the transistor M9 is coupled to a source of the transistor M11. Gates of the transistors M11-M12 receives the control signal DCKB. A drain of the transistor M11 is coupled to drains of the transistors M12-M13, a drain of the transistor M14, and first terminals of the inverters 1010-1020. A source of the transistor M13 is coupled to a drain of the transistor M10. Gates of the transistors M13-M14 receives the control signal DCK. A source of the transistor M12 is coupled to a drain of the transistor M16. Sources of the transistors M10 and M16 are coupled to the voltage terminal VSS. A source of the transistor M14 is coupled to a drain of the transistor M15. A source of the transistor M15 is coupled to the voltage terminal VDDM. Gates of the transistors M15-M16 are coupled to a second terminal of the inverter 1010. The inverter 1020 outputs a signal Q at its second terminal.

In some embodiments, the sense amplifier 100 is further coupled to transistors M17-M18. For illustration, gates of the transistors M17-M18 are coupled to the data line DLB. Drains of the transistors M17-M18 are coupled to an input pad configured to be floating. A source of the transistor M17 is coupled to the voltage terminal VDDM, and a source of the transistor M18 is coupled to the voltage terminal VSS.

In some embodiments, the sense amplifier 100 is configured to operate as a combination of a level shifter (change the voltage swing of the input signal DIN) and a master latch of a D-flip-flop. The latch circuit 1000 is configured to operate as a slave latch of the D-flip-flop. For example, in operation, the input signal DIN has a logic "0". In the latch mode, the output signal OS2 is outputted to the latch circuit 1000 through the data line DL. The output signal OS2 and the control signal DCKB/DCLK_2D have a logic "0", and the control signal DCK has a logic "1." Accordingly, the voltage VDDM is transmitted to the node QB through the transistors M9 and M11 being turned on. Accordingly, a logic value of the node QB is "1." The inverter 1020 inverts a signal received from the node QB and outputs a signal Q having a logic value "0."

The configurations of FIG. 10 are given for illustrative purposes. Various implements are within the contemplated scope of the present disclosure. For example, in some embodiments, the transistors M17-M18 are omitted.

Figure 11:
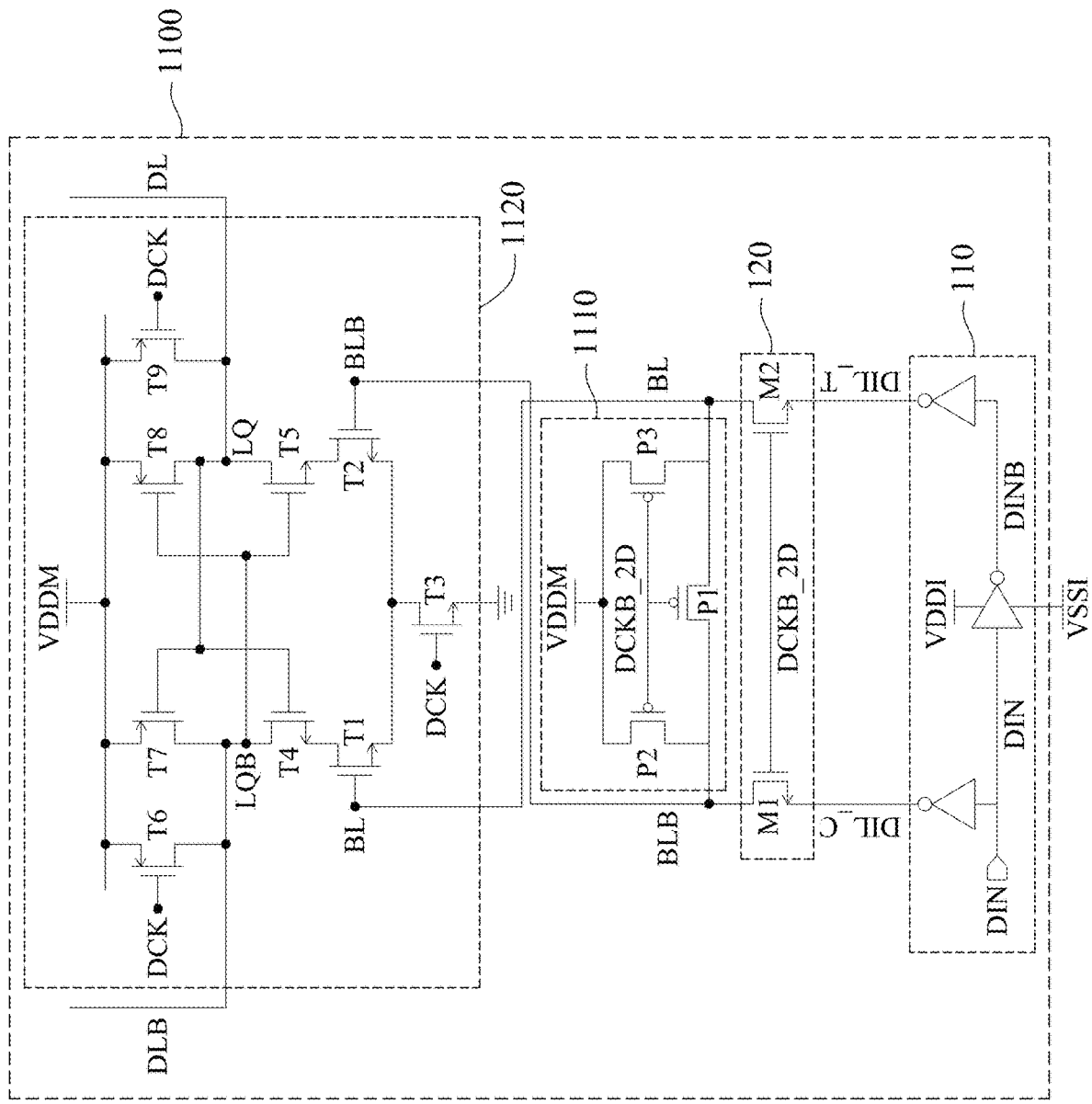
FIG. 11 is a schematic diagram of a sense amplifier in the integrated circuit of FIG. 1, in accordance with other embodiments of the present disclosure.

Reference is now made to FIG. 11. FIG. 11 is a schematic diagram of a sense amplifier 1100 in the integrated circuit 10 of FIG. 1, in accordance with other embodiments of the present disclosure. With respect to the embodiments of FIGS. 1-10, like elements in FIG. 11 are designated with the same reference numbers for ease of understanding.

Compared with the sense amplifier 100 in FIG. 2, instead of having the latch circuit 130, the sense amplifier 1100 includes a precharge circuit 1110 and a latch circuit 1120. For illustration, the precharge circuit 1110 is coupled to the switching circuit 120 and the latch circuit 1120 through data lines BL and BLB. The latch circuit 1120 is coupled to the data lines DL and DLB.

The precharge circuit 1110 includes P-type transistors P1-P3. For illustration, gates of the transistors P1-P3 are coupled together to receive the control signal DCKB_2D. A drain/source of the transistor P1 is coupled to a drain of the transistor P2 and the data line BLB. A source/drain of the transistor P1 is coupled to a drain of the transistor P3 and the data line BL. Sources of the transistors P2-P3 is coupled to the voltage terminal VDDM.

The latch circuit 1120 includes N-type transistors T1-T5 and P-type transistors T6-T9. For illustration, gates of the transistors T1-T2 are coupled to the data line BL and data line BLB respectively. Sources of the transistors T1-T2 are coupled together with a drain of the transistor T3. A gate of the transistor T3 receives the control signal DCK, and a source of the transistor T3 is coupled to a ground. Drains of the transistors T1-T2 are coupled to sources of the transistors T4-T5 respectively. A gate of the transistor T5 is coupled to a gate of the transistor T8, drain of the transistors T4, T6, T7, and the data line DLB at the node LQB. A drain of the transistor T5 is coupled to gates of transistors T4, T7, drains of the transistors T8-T9, and the data line DL at the node LQ. Gates of the transistors T6 and T9 receive the control signal DCK. Sources of the transistors T6-T9 are coupled to the voltage terminal VDDM.

In some embodiments, when the control signal DCKB_2D has the logic "1", the sense amplifier 1100 operates in the transparent mode. Accordingly, the precharge circuit 1110 is turned off. The switching circuit 120 is turned on, and voltage levels of the data lines BL and BLB are adjusted according to the input signals DIN_T and DIN_C. For example, the voltage level of the input signal DIN is about 0 Volt (i.e., logic "0".) The voltage level of the data line BL is about 0 Volt and the voltage level of the data line BLB is determined by the voltage VDDI. The voltage level of the control signal DCKB_2D, and the threshold voltage of the transistor M1 to have a logic "1". Furthermore, the control signal DCK has a logic "0". Accordingly, the transistors T6 and T9 in the sense amplifier 1100 are turned on to charge the data lines DL and DLB with the voltage VDDM.

When the control signal DCKB_2D turns to have the logic "0", the sense amplifier 1100 operates in the latch mode. In some embodiments, the transistors T6 and T9 in the sense amplifier 1100 are turned off and the transistor T3 is turned on in response to the control signal DCK turning to have a logic "1." Because the voltage level of the data line BLB is higher than that of the data line BL, a gate-source voltage (Vgs) of the transistor T2 is greater than that of the transistor T1. A voltage level of the source of the transistor T5 is therefore pulled down (discharged) by the transistor T2, and correspondingly, a gate-source voltage (Vgs) of the transistor T5 is greater than that of the transistor T4. Accordingly, the data line DL is discharged through the transistors T5 and T2 to 0 Volt (logic 0) while the voltage level of the data line DLB remains at the VDDM.

Moreover, in some embodiments, the transistor P1 in the precharge circuit 1110 is turned on in the latch mode and configured as an equalizer to balance the voltage levels of the data lines BL and BLB. In operation, the transistors P1-P3 are turned on to charge the data lines BL and BLB slowly with the voltage VDDM. Accordingly, the transistors T1 and T2 in the latch circuit 1120 are gradually turned on. The latch circuit 1120 therefore operates as a latch circuit to store the data at the nodes LQ and LQB.

The configurations of FIG. 11 are given for illustrative purposes. Various implements are within the contemplated scope of the present disclosure. For example, in some embodiments, instead of applying the control signal DCKB_2D, the control signal DCKB is utilized for controlling the switching circuit 120.

As described above, the integrated circuit in the present disclosure provides a sense amplifier transferring the power domains and latching data synchronously. Less area and lower active power are required in the present disclosure. Furthermore, with the configurations of the present disclosure, input signals propagate successfully between two power domains in which there is a great voltage gap.

In some embodiments, a device is disclosed. The device includes an input stage circuit, a switching circuit, and a first latch circuit. The input stage circuit generates a first input signal having a first voltage and a second input signal based on a third input signal. The switching circuit operates in response to a first control signal, and adjusts a voltage level of a first data line according to the first input signal and a voltage level of a second data line according to the second input signal. The first latch circuit is coupled to the switching circuit by the first data line and the second data line. The first latch circuit latches a data in response to the first control signal and a second control signal, and adjusts the voltage level of the first data line based on a second voltage different from the first voltage.

Also disclosed is a device that includes a first inverter and a second inverter, a first transistor, a second transistor and a third transistor. The first inverter and the second inverter are cross coupled between a first node and a second node. The first transistor couples a first terminal, proving a first supply voltage, to the first inverter and the second inverter in response to a first control signal. The second transistor couples a second terminal, providing a second supply voltage, to the first inverter and the second inverter in response to a second control signal. The third transistor is coupled to the first node and a fourth transistor coupled to the second node. Gates of the third transistor and the fourth transistor receive a third control signal. When the third control signal has a first logic value, the third transistor outputs a first output signal to the first node and the fourth transistor outputs a second output signal to the second node. When the third control signal has a second logic value, the first transistor transmits the first voltage to the first node and the second transistor transmits the second voltage to the second node.

Also disclosed is a method includes operations: receiving a first input signal by a sense amplifier and generating a second input signal and a third input signal; in a transparent mode, generating, by the sense amplifier, a first output signal associated with the second input signal at a first node and a second output signal associated with the third input signal at a second node, in which the first output signal and the second output signal have different logic values; in a latch mode, latching, by the sense amplifier, a first data at the first node according to the first output signal, and latching, by the sense amplifier, a second data at the second node according to the second output signal; and adjusting, by the sense amplifier, a voltage swing of one of the first output signal and the second output signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
an input stage circuit configured to receive a first input signal and generate a second input signal and a third input signal based on the first input signal in a first voltage domain;
a switching circuit configured to couple or decouple the second input signal and the third input signal to a first data line and a second data line respectively, based on a first control signal;
a first latch circuit coupled to the switching circuit by the first data line and the second data line,
wherein the first latch circuit is configured to latch a data based on the second input signal and third input signal in response to the first control signal having a first logic value, and configured to pull up or pull down the first data line and pull down or pull up the second data line respectively in a second voltage domain in response to the first control signal having a second logic value; and
a pair of first transistors and a pair of second transistors that are coupled between the second data line and an output terminal in the second voltage domain and configured to generate an output signal in response to the third input signal, a second control signal and a third control signal,
wherein the first control signal and the third control signal have the same logic value different from that of the second control signal.

2. The device of claim 1, further comprising:
a control signal generator configured to generate the first control signal in the second voltage domain.

3. The device of claim 1, wherein the first latch circuit comprises:
a first inverter and a second inverter that are crossed coupled with each other between the first data line and the second data line;
a pull up circuit configured to decouple a first terminal, providing a first supply voltage, from first terminals of the first to second inverters in response to the first control signal having the second logic value; and
a pull down circuit configured to decouple a second terminal, providing a second supply voltage, from second terminals of the first to second inverters in response to a second control signal having the first logic value.

4. The device of claim 3, further comprising:
a control signal generator configured to delay the first control signal to generate the second control signal in the second voltage domain.

5. The device of claim 1, further comprising:
a first transistor, in the second voltage domain, having a gate terminal coupled to the first latch circuit through the first data line and a drain terminal being floating; and
a second transistor having a gate terminal coupled to the first data line, a source terminal, and a drain terminal being floating.

6. The device of claim 5, wherein the first transistor and the second transistor are of different conductivity types.

7. The device of claim 5,
wherein the pair of first transistors and the pair of second transistors are in a second latch circuit, wherein the second latch circuit is coupled to the first latch circuit through the second data line and configured to generate the output signal in the second voltage domain in response to the second and third control signals that are delayed from the first control signal.

8. The device of claim 1,
wherein the pair of first transistors and the pair of second transistors are in a second latch circuit, wherein the second latch circuit is coupled to the first latch circuit through the second data line and configured to decouple the output terminal from the first latch circuit in response to the first control signal having the second logic value and the second control signal,
wherein the first and second control signals have different logic values.

9. A device, comprising:
a first inverter and a second inverter that are cross coupled between a first node and a second node;
a third inverter configured to generate, in response to a first input signal, a second input signal in a first voltage domain;
a fourth inverter configured to generate, in response to the first input signal, a third input signal in the first voltage domain;
a first transistor configured to couple a first terminal, proving a first supply voltage in a second voltage domain, to the first inverter and the second inverter in response to a first control signal;
a second transistor configured to couple a second terminal, providing a second supply voltage in the second voltage domain, to the first inverter and the second inverter in response to a second control signal;
a third transistor and a fourth transistor, wherein gates of the third transistor and the fourth transistor receive a third control signal, and the third and fourth transistors are configured to couple or decouple the second input signal and the third input signal to the first node and the second node respectively based on the third control signal; and
a fifth inverter configured to generate, in response to a first clock signal of the device, the first control signal in the second voltage domain;

a sixth inverter coupled to an output of the fifth inverter and configured to generate, in response to the first control signal, the second control signal in the second voltage domain; and a seventh inverter coupled to an output of the sixth inverter and configured to generate, in response to the second control signal, the third control signal in the second voltage domain.

10. The device of claim 9, further comprising:

a fifth transistor and a sixth transistor that are coupled in series between the first and second terminals in the second voltage domain, wherein gate terminals of the fifth and sixth transistors are coupled to the second node; and a seventh transistor coupled between the fifth and sixth transistors and configured to generate, in response to the third control signal, an output signal in the second voltage domain.

11. The device of claim 9, wherein a voltage swing of the first voltage domain is smaller than a voltage swing of the second voltage domain.

12. The device of claim 9, further comprising:

an output stage circuit coupled between the first and second nodes and data terminals coupled to a memory cell, wherein the output stage circuit is configured to perform NOR operations to a second clock signal and logic states of the first and second nodes to control signal transmitted to the data terminals.

13. The device of claim 9, wherein a voltage swing of the first voltage domain is the same as a voltage swing of the second voltage domain.

14. A method, comprising:

receiving a first input signal by a sense amplifier and generating a second input signal and a third input signal based on the first input signal in a first voltage domain;

in a transparent mode, coupling the second input signal and the third input signal to a first data line and a second data line respectively based on a first control signal;

in a latch mode, pulling up or pulling down the first data line and pulling down or pulling up the second data line respectively in a second voltage domain; and generating, by a pair of first transistors and a pair of second transistors coupled between the second data line and an output terminal in the second voltage domain, an output signal in response to the third input signal, a second control signal and a third control signal, wherein the first control signal and the third control signal have the same logic value different from that of the second control signal.

15. The method of claim 14, further comprising:

in the transparent mode, decoupling the second data line from a latch circuit having two terminals coupled to the second data line in response to the first control signal and the second control signal.

16. The method of claim 14, further comprising:

in the latch mode, latching data, by a latch circuit coupled to the second data line, in response to the second control signal and the third control signal.

17. The method of claim 14, wherein a voltage swing of the first voltage domain is greater than a voltage swing of the second voltage domain.

18. The method of claim 14, further comprising:

in the latch mode, decoupling the first data line and the second data line from the second input signal and the third input signal.

19. The device of claim 1, wherein the pair of first transistors and the pair of second transistors are of different conductivity types.

20. The device of claim 9, wherein the sixth inverter is coupled between the fifth inverter and the seventh inverter.

* * * * *